(12) United States Patent
Hiramatsu et al.

(10) Patent No.: US 10,711,186 B2
(45) Date of Patent: Jul. 14, 2020

(54) PHOSPHOR, PRODUCING METHOD THEREOF, AND LIGHT-EMITTING DEVICE EMPLOYING THE PHOSPHOR

(71) Applicants: Kabushiki Kaisha Toshiba, Minato-ku (JP); TOSHIBA MATERIALS CO., LTD., Yokohama-shi (JP)

(72) Inventors: Ryosuke Hiramatsu, Yokohama (JP); Keiko Albessard, Yokohama (JP); Kunio Ishida, Fuchu (JP); Yasushi Hattori, Kawasaki (JP); Masahiro Kato, Naka (JP)

(73) Assignees: Kabushiki Kaisha Toshiba, Minato-ku (JP); TOSHIBA MATERIALS CO., LTD., Yokohama-shi (JP)

( * ) Notice: Subject to any disclaimer, the term of this patent is extended or adjusted under 35 U.S.C. 154(b) by 0 days.

(21) Appl. No.: 15/659,738

(22) Filed: Jul. 26, 2017

(65) Prior Publication Data

US 2017/0335183 A1    Nov. 23, 2017

Related U.S. Application Data

(63) Continuation of application No. PCT/JP2016/053826, filed on Feb. 9, 2016.

(30) Foreign Application Priority Data

Feb. 12, 2015   (JP) ................................ 2015-025284

(51) Int. Cl.
*C09K 11/59*   (2006.01)
*C09K 11/77*   (2006.01)
(Continued)

(52) U.S. Cl.
CPC ............ *C09K 11/59* (2013.01); *C09K 11/617* (2013.01); *C09K 11/7721* (2013.01);
(Continued)

(58) Field of Classification Search
None
See application file for complete search history.

(56) References Cited

U.S. PATENT DOCUMENTS 7,358,542 B2   4/2008   Radkov et al.
7,597,822 B2   10/2009  Saruta
(Continued)

FOREIGN PATENT DOCUMENTS

JP   11-228949 A      8/1999
JP   2007-308641 A    11/2007
(Continued)

OTHER PUBLICATIONS

International Search Report dated May 10, 2016 in PCT/JP2016/053826, filed on Feb. 9, 2016.

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

Embodiments of the present invention provide a phosphor improved in the emission intensity maintenance ratio without impairing the emission intensity and further a light-emitting device employing that phosphor. The phosphor is activated by manganese and has a basic structure comprising at least one element selected from the group consisting of potassium, sodium and calcium; at least one element selected from the group consisting of silicon and titanium; and fluorine. In an IR absorption spectrum of the phosphor, the intensity ratio of the peak in 3570 to 3610 $cm^{-1}$ to that in 1200 to 1240 $cm^{-1}$ is 0.1 or less.

10 Claims, 3 Drawing Sheets

(51) Int. Cl.
  *H01L 33/50* (2010.01)
  *C09K 11/61* (2006.01)

(52) U.S. Cl.
  CPC ...... *C09K 11/7734* (2013.01); *C09K 11/7774* (2013.01); *C09K 11/7792* (2013.01); *H01L 33/502* (2013.01); *H01L 33/504* (2013.01); *H01L 2224/48091* (2013.01); *H01L 2224/48247* (2013.01); *H01L 2933/0041* (2013.01)

(56) References Cited

U.S. PATENT DOCUMENTS

| | | | |
|---|---|---|---|
| 7,923,918 B2 | 4/2011 | Tamaki et al. | |
| 8,491,816 B2 | 7/2013 | Hong et al. | |
| 8,907,558 B2 | 12/2014 | Hiramatsu et al. | |
| 2010/0142189 A1* | 6/2010 | Hong | C09K 11/616 362/97.3 |
| 2015/0329770 A1* | 11/2015 | Kaneyoshi | B05D 1/18 252/301.36 |
| 2015/0380613 A1 | 12/2015 | Hiramatsu et al. | |
| 2015/0380614 A1 | 12/2015 | Hiramatsu et al. | |
| 2016/0024378 A1* | 1/2016 | Murphy | C09K 11/617 362/84 |
| 2016/0090528 A1* | 3/2016 | Yoshida | C09K 11/617 257/98 |
| 2016/0347998 A1* | 12/2016 | Kaneyoshi | C09K 11/617 |
| 2017/0158957 A1* | 6/2017 | Hong | C09K 11/616 |

FOREIGN PATENT DOCUMENTS

| | | |
|---|---|---|
| JP | 2009-528429 | 8/2009 |
| JP | 2010-209311 | 9/2010 |
| JP | 2010-251621 | 11/2010 |
| JP | 2011-12091 | 1/2011 |
| JP | 2013-189588 | 9/2013 |
| JP | 2014-141684 | 8/2014 |
| JP | 2014-177511 | 9/2014 |
| JP | 2014-177586 | 9/2014 |
| JP | 2014-221890 A | 11/2014 |
| JP | 2016-155899 | 9/2016 |
| TW | 200946646 A1 | 11/2009 |
| WO | WO 2004/081140 A1 | 9/2004 |
| WO | WO 2014/141851 A1 | 9/2014 |

\* cited by examiner

PHOSPHOR, PRODUCING METHOD THEREOF, AND LIGHT-EMITTING DEVICE EMPLOYING THE PHOSPHOR

CROSS REFERENCE TO RELATED APPLICATIONS

This application is based upon and claims the benefit of priority from the prior Japanese Patent Application No. 2015-025284, filed on Feb. 12, 2015, the entire contents of which are incorporated herein by reference.

FIELD

The present invention relates to a phosphor, a producing method thereof and a light-emitting device employing the phosphor.

BACKGROUND

A light-emitting diode (LED) light-emitting device mainly comprises a combination of a phosphor and a LED chip serving as an excitation light source, and can realize various colors of emission light according to the combination.

Specifically, a white LED light-emitting device, which radiates white emission light, comprises a phosphor in combination with a LED chip that emits light in the blue region. For example, the device comprises a phosphor mixture and a LED chip giving off blue light. In practice, a phosphor emitting yellow light, which is complementary to blue light, is often adopted as the phosphor to produce a pseudo-white LED light-emitting device. Further, a three-wavelength white LED device is also developed which comprises a LED chip emitting blue light, a green- or yellow-light emitting phosphor and a red-light emitting phosphor. As an example of the red-light emitting phosphor used in that light-emitting device, $K_2SiF_6$:Mn phosphor is known.

Meanwhile, conventional fluoride phosphors tend to reduce the emission intensity in course of time. However, if the phosphors are intended to be used in light-emitting devices, the emission intensity preferably changes little. In other words, the emission intensity maintenance ratio is preferred to be high. It is hence required to improve the emission intensity maintenance ratio. For the purpose of meeting that requirement, it is reported that the phosphors are surface-treated with a solution containing a surface-treatment agent selected from the group consisting of: (A) organic amines, (B) quaternary ammonium salts, (C) alkyl betaines or fluorine-containing surfactants, (D) alkoxysilanes, and (E) fluorine-containing polymers, so as to improve durability of the phosphors under conditions of high temperature and high humidity. However, in order that the phosphors can be subjected to the above treatment after they are synthesized, the step of the treatment must be additionally carried out after the synthesizing process of the phosphors. Accordingly, there is a problem of increasing the production cost. Further, if conventional fluoride phosphors are brought into contact with water, their emission intensity generally tends to go down. The phosphors, hence, may reduce the emission intensity if surface-treated with a water-containing solution like the above treatment solution after they are synthesized

DETAILED DESCRIPTION

Figure 1:
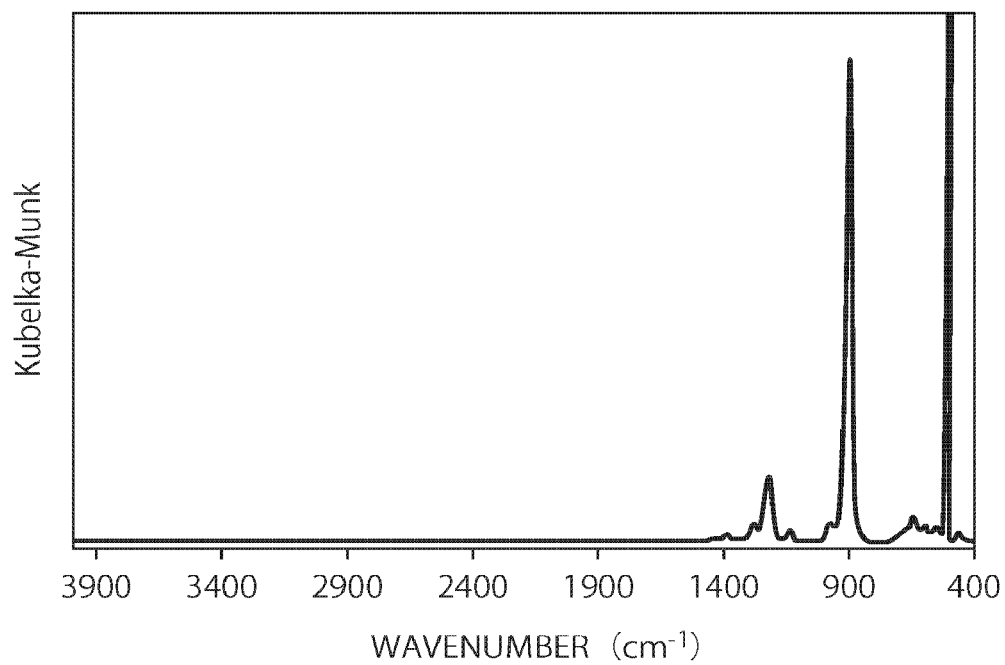
FIG. 1 shows an IR absorption spectrum of the phosphor according to an embodiment of the present invention.

The phosphor according to an embodiment of the present invention is characterized by having a basic structure comprising at least one element selected from the group consisting of potassium, sodium and calcium; at least one element selected from the group consisting of silicon and titanium; and fluorine;

wherein said phosphor is a manganese-activated fluoride phosphor; and shows an IR absorption spectrum in which the intensity ratio of the peak in the range of 3570 to 3610 $cm^{-1}$ to that in the range of 1200 to 1240 $cm^{-1}$ is 0.1 or less.

The light-emitting device according to an embodiment of the present invention comprises:

a light-emitting element radiating light with a peak in the wavelength range of 440 to 470 nm inclusive, and a phosphor layer which contains the above phosphor.

Further, the method for producing a phosphor according to an embodiment of the present invention comprises:

synthesizing a manganese-activated fluoride phosphor having a basic structure comprising at least one element selected from the group consisting of potassium, sodium and calcium; at least one element selected from the group consisting of silicon and titanium; and fluorine; and then subjecting said phosphor to a stirring treatment in an organic solvent for 1 minute or more.

Embodiments of the present invention will now be explained below in detail. However, it is noted that the embodiments described below are provided only for the purpose of illustrating phosphors or light-emitting devices embodying the technical concept of the present invention, and hence the present invention is by no means limited to the following examples Further, this specification is not intended to restrict the members or components mentioned in the claims to the described embodiments. In particular, the sizes, materials, shapes, arrangement and the like of the components described in the embodiments are intended not to limit the scope of the present invention but to provide merely illustrative examples. Incidentally, the sizes and positional relationship of the members shown in the drawings may be exaggerated for the purpose of clarifying the explanation. The same names or same reference numbers in the drawings indicate the same or equivalent members or components, and hence detailed description thereof will be omitted. Some of the components constituting the present embodiments may be so integrated into one member that the member may function as the plural components, and on the contrary some members may share the function of one component.

The applicant has researched and studied manganese-activated phosphors having basic structures comprising at least one element selected from the group consisting of potassium, sodium and calcium; at least one element selected from the group consisting of silicon and titanium; and fluorine; for example, phosphors mainly comprising potassium silicofluoride activated by manganese, and as a result, finally found that the emission intensity maintenance ratio is correlated with a ratio between particular peak intensities in the IR absorption spectrum (hereinafter, often referred to as "IR spectrum") of the phosphor.

The phosphor of the embodiment contains at least one element selected from the group consisting of potassium, sodium and calcium; at least one element selected from the group consisting of silicon and titanium; and fluorine. Specifically, potassium silicofluoride is a typical example of the basic structure of the phosphor according to the embodiment. That phosphor is activated by manganese, and generally absorbs light in the UV to blue region and then emits red luminescence.

Here, the "phosphors mainly comprising potassium silicofluoride" means potassium silicofluorides which serve as the basic crystal structures of the phosphors and also in which the elements are partly so replaced with other elements as to be capable of emitting light. The replacing elements are, for example, sodium, cesium, calcium and titanium, but other elements can be adopted. The basic composition of the phosphor can be represented by the following formula (A).

As an embodiment of the present invention, the phosphor is preferably represented by the following formula (A):

$$(K_{1-p}M_p)_a(Si_{1-x-y}Ti_xMn_y)F_b \qquad (A).$$

In the formula, M is at least one selected from the group consisting of Na and Ca, and p, a, b, x and y are numbers satisfying the conditions of
 $0 \leq p \leq 0.1$,
 $1.5 \leq a \leq 2.5$,
 $5.5 \leq b \leq 6.5$,
 $0 \leq x \leq 0.3$, and
 $0 < y \leq 0.06$, respectively.

The phosphor of the embodiment contains manganese as an activator. The manganese preferably has a valence of +4 so that the phosphor can serve as a red-light emitting phosphor. The phosphor may contain manganese of other valences, but the amount thereof is preferably small and it is particularly preferred for all the manganese atoms to have a valence of +4.

If not containing manganese (namely, in the case of y=0), the phosphor cannot be observed to emit luminescence even when excited by light having an emission peak in the UV to blue region. Accordingly, y in the formula (A) must be larger than 0. Further, y is preferably 0.01 or more because the luminous efficiency tends to be improved according as the manganese content increases.

On the other hand, however, if the manganese content is too high, the emission intensity of the phosphor tends to be lowered because of concentration quenching. The manganese content (y) is hence preferably 0.06 or less, more preferably 0.05 or less to avoid the quenching.

As described above, the phosphor according to the embodiment may contain elements other than the main constituting elements, such as, K, Si, F and Mn. For example, small amounts of Na, Ca and Ti may be contained. Even if containing those elements in small amounts, the phosphor shows such a similar emission spectrum in the red wavelength range as can achieve the aimed effect. However, in view of the stability of the phosphor and the cost for synthesizing the phosphor, those elements are contained preferably only in small amounts. Further, the phosphor may contain elements other than those described here as inevitable ingredients. Even if so, the effect of the embodiment can be satisfyingly obtained in general.

The content of each element in the phosphor can be analyzed, for example, in the following manner. For analyzing the metal elements such as K, Na, Ca, Si, Ti and Mn, the synthesized phosphor is subjected to alkali fusion and then analyzed according to ICP emission spectroscopy by means of, for example, IRIS Advantage ICP spectrometer ([trademark], manufactured by Thermo Fisher Scientific Inc.). For analyzing the non-metal element F, the synthesized phosphor is subjected to thermal hydrolysis and then analyzed by means of, for example, DX-120 ion chromatograph system ([trademark], manufactured by Nippon Dionex K.K.). However, the element F can be analyzed by ion chromatography after the alkali fusion procedure is carried out in the same manner as the above metal elements.

Although stoichiometrically containing no oxygen, the phosphor according to the embodiment is often inevitably contaminated with oxygen by decomposition of the surface during or after the synthesizing process thereof. The oxygen content in the phosphor is ideally equal to zero, but in practice preferably satisfies the condition of: [oxygen content]/[(fluorine content)+(oxygen content)]<0.05 because the luminous efficiency is not seriously lowered under that condition.

Manganese-activated fluoride phosphors having basic structures comprising potassium, silicon and fluorine have been conventionally employed in light-emitting devices. When those light-emitting devices work continuously, the emission intensity of the phosphors generally goes down in course of time to lead a shift in the emission color. In order to solve this problem, various methods have been developed. However, there is room for improvement in all of them. The applicant has studied this problem, and finally found that among the above phosphors, a phosphor showing a particular IR spectrum has excellent properties. Specifically, the phosphor has excellent properties if showing an IR spectrum in which the ratio of the peak intensity (hereinafter, often referred to as $I_{3590}$) in the range of 3570 to 3610 cm$^{-1}$ to that (hereinafter, often referred to as $I_{1220}$) in the range of 1200 to 1240 cm$^{-1}$, namely, the intensity ratio ($I_{3590}/I_{1220}$) is 0.1 or less.

The above IR spectrum intensity ratio is considered to depend on the amount of OH groups in the phosphor. Specifically, as described later, the peak in 3570 to 3610 cm$^{-1}$ is presumed to correspond to the OH bond characteristic vibration. Accordingly, if containing OH bonds only in a small amount, the phosphor is considered to exhibit excellent properties.

The method for measuring the IR spectrum is not particularly restricted. For example, the IR spectrum can be measured with an IR spectrophotometer, such as, XERTEX70V FT-IR spectrometer ([trademark], manufactured by Bruker Optics K.K.). The measurement conditions are, for example, as follows:
 wavenumber resolution: 4 cm$^{-1}$,
 sample scanning times: 100 times,
 measuring wavenumber range: 350 to 4000 cm$^{-1}$.

There are some methods, such as, transmission method, reflection method and ATR method, to measure IR spectra. The phosphor according to the embodiment is generally in the form of powder consisting of a few to 60 μm-size particles, and hence the IR spectrum thereof is preferably measured by the diffusion reflection method, in which the sample can be easily prepared and measured. When measured by the diffusion reflection method, the sample is generally diluted with KBr or KCl, which are transparent in the IR region, to a proper concentration (about 1 to 10%). However, the phosphor of the embodiment shows an IR spectrum having a weak peak intensity at around 3590 cm$^{-1}$. Accordingly, it is preferred to carry out the measurement without the diluent. However, the background is preferably measured by use of KBr or KCl.

Figure 2:
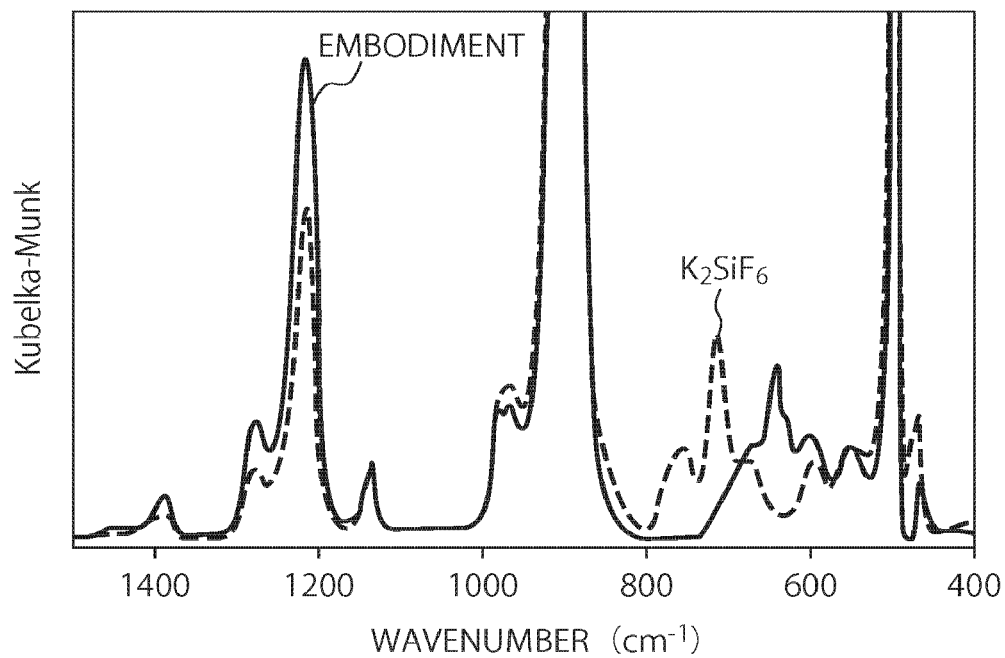
FIG. 2 shows an enlarged IR absorption spectrum in about 400 to 1500 $cm^{-1}$ given by the phosphor according to an embodiment of the present invention.

FIGS. 1 and 2 show examples of IR spectra given by a phosphor according to the embodiment. The IR spectrum of FIG. 1 is enlarged in 400 to 1500 cm$^{-1}$, and the enlarged spectrum is shown in FIG. 2 together with an IR spectrum of powdery $K_2SiF_6$ not activated by Mn (which is, for example, commercially available from KANTO CHEMICAL Co., Inc.). As shown in FIG. 2, the Mn-activated phosphor and the powdery $K_2SiF_6$ not activated by Mn both exhibit similar peaks in about 800 to 1500 cm$^{-1}$. This fact suggests that the peaks in about 800 to 1500 cm$^{-1}$ correspond to a normal mode of $K_2SiF_6$ matrix crystal.

Figure 3:
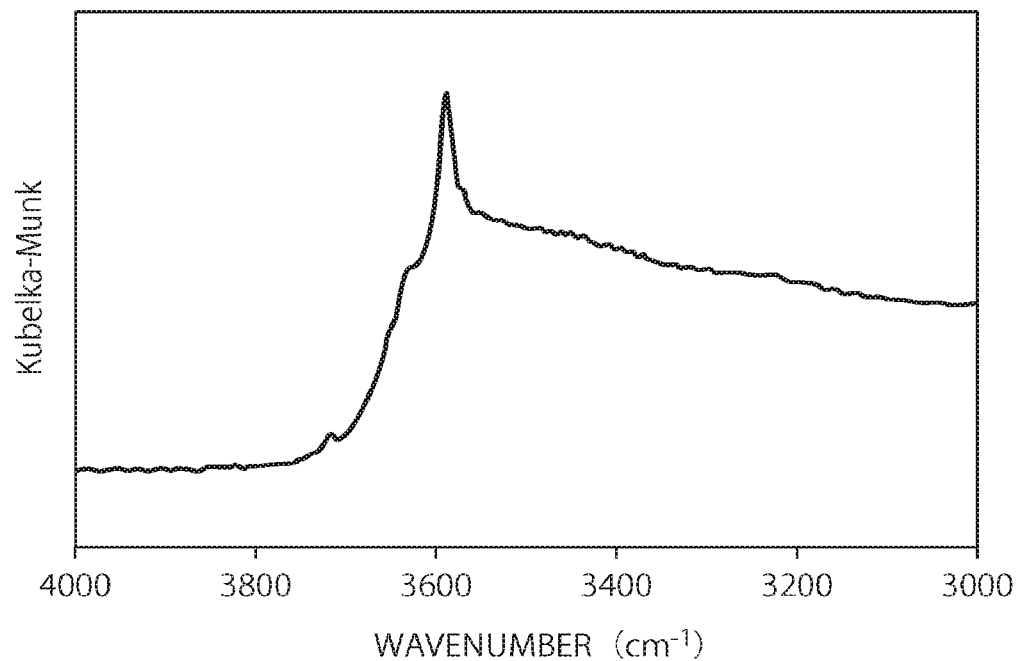
FIG. 3 shows an enlarged IR absorption spectrum in about 3000 to 4000 $cm^{-1}$ given by the phosphor according to an embodiment of the present invention.

Meanwhile, FIG. 3 shows an enlarged IR spectrum in 3000 to 4000 cm$^{-1}$ given by the phosphor of the embodiment. As shown in FIG. 3, there is a vibration peak at about 3590 cm$^{-1}$ in the spectrum. According to literature of prior studies and the like, this vibration peak is presumed to be assigned to lone OH groups in the phosphor. The present embodiment is achieved on the basis of finding that the properties of the phosphor are correlated with the peak intensity ($I_{3590}$) at about 3590 cm$^{-1}$. However, IR measurement is difficult to use for quantitative evaluation, and hence it is difficult to clearly demonstrate the correlation of the phosphor properties directly with the peak intensity ($I_{3590}$) at about 3590 cm$^{-1}$. In view of that, the obtained IR spectrum is subjected to Kubelka-Munk conversion, and then the peak intensity at about 1220 cm$^{-1}$, which is presumed to be attributed to a normal mode of $K_2SiF_6$ crystal, is adopted as a referential standard. Specifically, the relative intensity of the peak at about 3590 cm$^{-1}$ to the referential standard ($I_r = I_{3590}/I_{1220}$) is determined so as to reveal the correlation between the phosphor properties and the relative intensity $I_r$.

The positions (wavenumbers) of the above peaks in the IR spectrum are often shifted according to the composition of the phosphor or the synthesizing condition thereof. Specifically, the two peak positions (3590 cm$^{-1}$ and 1220 cm$^{-1}$), which are essential factors of the present embodiment, may be shifted within about ±20 cm$^{-1}$ in general or within about ±10 cm$^{-1}$ even under preferred conditions.

It is not fully clear why the phosphor has excellent properties when showing an IR spectrum with the relative intensity $I_r$ in the above range. However, it is presumed that, if incorporated in a light-emitting device, the phosphor having a fluoride matrix is heated and consequently undergoes hydrolysis while the device keeps working. As a result, the emission intensity is considered to go down.

The above relative intensity $I_r$ is necessarily 0.1 or less, preferably 0.005 or less, more preferably 0.002 or less. It is most preferred for the relative intensity $I_r$ to be 0, but the relative intensity $I_r$ is generally 0.00001 or more.

The above peak intensity at about 3590 cm$^{-1}$ may change if the phosphor is subjected to post-treatments, such as surface treatment, after synthesized. It is hence preferred to carry out the IR measurement for evaluation before the post-treatments.

There are no particular restrictions on the method for producing the phosphor according to the embodiment. For example, it can be obtained by the following methods.

The fluoride phosphor according to the embodiment can be synthesized in a manner (i) where a Si-containing material and a Ti-containing material are combined with potassium permanganate and/or sodium permanganate and then made to react in a hydrofluoric acid aqueous solution; or (ii) where a potassium-containing material and/or a sodium-containing material are added into a hydrofluoric acid aqueous solution in which a mixture of hexafluorosilicic acid with potassium hexafluoromanganate ($K_2MnF_6$) or with sodium hexafluoromanganate is beforehand dissolved, so that they are made to react to synthesize the phosphor by a co-precipitation method or a poor solvent precipitation method In either production method, the phosphor of the embodiment can be obtained by a process in which the synthesis is carried out in a hydrofluoric acid-containing aqueous solution and thereafter the product is subjected to suction filtration or washing and then dried.

In the above processes for synthesizing the phosphor of the embodiment, the HF concentration in the reaction solution is preferably kept to be 20 wt % or more. Further, the phosphor formed in the reaction solution is preferably then dispersed in an organic solvent and subjected to a stirring treatment, for example, for 1 minute or more, preferably 10 minutes or more.

Examples of the organic solvent include: ketones, such as, acetone, methyl ethyl ketone and diethyl ketone; alcohols, such as, methanol and ethanol; and esters, such as, methyl acetate and ethyl acetate. Among them, ketones are preferred and acetone is particularly preferred. The amount of the organic solvent must be sufficient to disperse the phosphor, and is generally 10 times or more, preferably 50 times or more the weight of the phosphor.

It was verified that, even if subjected to the above treatment, the phosphor having a basic composition represented by the formula (A) hardly reduces the internal quantum efficiency thereof.

The internal quantum efficiency η' is calculated according to the following formula:

$$\eta' = \frac{\int \lambda \cdot [P(\lambda)]d\lambda}{\int \lambda \cdot [E(\lambda) - R(\lambda)]d\lambda}$$

In the formula,

E(λ): the whole spectrum of light emitted by the excitation light source onto the phosphor (in terms of the number of photons), R(λ): the spectrum of light emitted by the excitation light source but reflected by the phosphor (in terms of the number of photons), and P(λ): the emission spectrum of the phosphor (in terms of the number of photons).

The internal quantum efficiency of the phosphor can be measured, for example, by means of C9920-02G absolute PL quantum yields measurement system ([trademark], manufactured by Hamamatsu Photonics K.K.). For measuring the above luminous property, blue light having a peak wavelength in about 440 to 470 nm with a half-width of 5 to 15 nm can be adopted as the excitation light. The internal quantum efficiency of the phosphor according to the embodiment was thus measured and thereby verified to satisfy the condition of: η'≥70%. If employing the phosphor having an internal quantum efficiency of less than that, the light-emitting device is poor in brightness. Further, in that device, light emitted from the light-emitting element is considerably converted not into red luminescence but into heat. As a result, the emission intensity of the phosphor in the device goes down at an accelerated rate to cause serious color drift. In view of that, the internal quantum efficiency η' is preferably 70% or more.

The phosphor of the embodiment may be classified with a sieve according to the coating method adopted for producing the light-emitting device. For producing a common white LED device, which adopts excitation light having an emission peak in the blue region, it is generally preferred to use the phosphor particles sieved to have a mean particle size of 1 to 50 μm. If the phosphor particles are sieved to be too small, the emission intensity may be lowered. On the other hand, if sieved to be too large, they may clog a nozzle of coating machine when the phosphor layer is formed in the LED device, and consequently the operational efficiency and production yield may be lowered and/or the resultant light-emitting device may exhibit light of uneven color.

The phosphor of the embodiment can be excited by an excitation light source showing an emission peak in the UV to blue region. When the phosphor is used in the light-emitting device, the excitation light source is preferably a light-emitting element having an emission peak in the wavelength range of 430 to 470 nm inclusive. In view of the luminous efficiency, it is not preferred to use light-emitting elements having emission peaks out of the above range. Examples of the light-emitting element include solid-state light source elements such as LED chips and laser diodes.

The phosphor according to the embodiment emits red luminescence, and therefore can be combined with green- and yellow-light emitting phosphors to obtain a white light-emitting device. What phosphors to use can be freely selected according to the purpose of the light-emitting device. For example, in the case of producing a device emitting white light with low color temperature, the phosphor of the embodiment is combined with a yellow-light emitting phosphor to obtain a device excellent in both efficiency and color rendering properties.

Green- and yellow-light emitting phosphors can be said to be phosphors having main emission peaks in the wavelength ranges of 520 to 550 nm inclusive and 550 to 570 nm inclusive, respectively. Examples of those phosphors include: silicate phosphors, such as, $(Sr,Ca,Ba)_2SiO_4$:Eu and $Ca_3(Sc,Mg)_2Si_3O_{12}$:Ce; aluminate phosphors, such as, $(Y,Gd)_3(Al,Ga)_5O_{12}$:Ce; sulfide phosphors, such as, $(Ca,Sr,Ba)Ga_2S_4$:Eu; and alkaline earth oxynitride phosphors, such as, $(Ca,Sr,Ba)Si_2O_2N_2$:Eu and Eu-activated (Ca,Sr)-αSiAlON, βSiAlON. Here, the "main emission peaks" means the wavelengths at which the phosphors exhibit the largest emission intensities in their emission spectra. The emission peaks of the exemplified phosphors have been already reported in various literature and the like. The emission peaks are often shifted within about 10 nm by small amounts of additive elements used in producing the phosphors or by slight fluctuation of the composition, but even the phosphors showing those shifted emission peaks are also included in the above exemplified phosphors.

According to the purpose, the light-emitting device employing the phosphor of the embodiment may further comprise orange- and/or red-light emitting phosphors other than the above.

Figure 4:
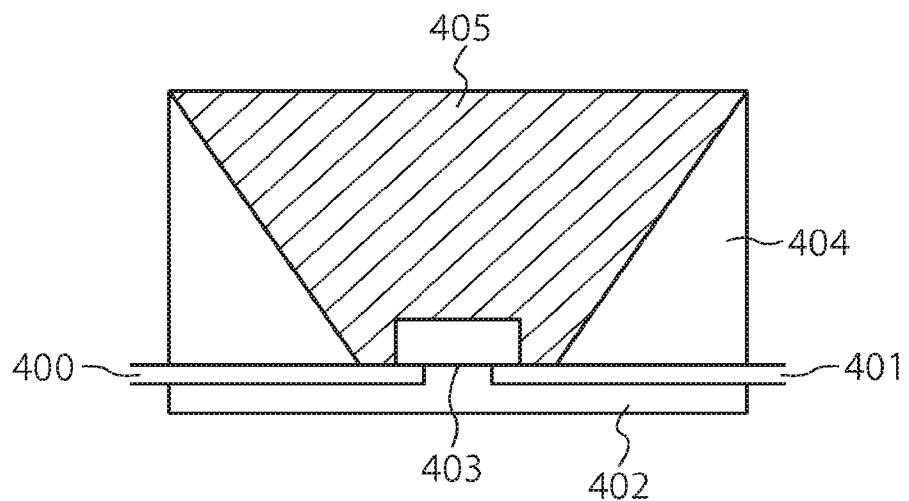
FIG. 4 shows a schematic sectional view of the light-emitting device according to an embodiment of the present invention.

Examples of the orange- and red-light emitting phosphors include: silicate phosphors, such as, $(Sr,Ca,Ba)_2SiO_4$:Eu; tungstate phosphors, such as, $Li(Eu,Sm)W_2O_8$; oxysulfide phosphors, such as, $(La,Gd,Y)_2O_2S$:Eu; sulfide phosphors, such as, (Ca,Sr,Ba)S:Eu; and nitride phosphors, such as, $(Sr,Ba,Ca)_2Si_5N_8$:Eu and $(Sr,Ca)AlSiN_3$:Eu. Those can be employed in combination with the phosphor of the embodiment so as to further improve not only the efficiency but also the color rendering properties for illumination use and the color gamut for backlight use. However, if too many phosphors are used, the light-emitting device may be impaired in the efficiency because of re-absorption emission phenomenon, in which absorption and emission are repeated among the phosphors, and/or because of scattering phenomenon. This must be paid attention to. FIG. 4 shows a schematic sectional view of a light-emitting device according to one embodiment of the present invention.

The shown device comprises leads 400 and 401, a stem 402, a semiconductor light-emitting element 403, a reflective surface 404, and a phosphor layer 405. The light-emitting element 403 is mounted with Ag paste or the like at the center of the bottom, and radiates UV or visible emission. Examples of the light-emitting element 403 include GaAs type and GaN type semi-conductor light-emitting diodes. The positions of the leads 400 and 401 can be adequately modified. The phosphor layer 405 is placed in the concavity of the device. It can be formed by dispersing the phosphor of the embodiment in a resin layer made of, for example, silicone resin in an amount of 5 to 50 wt % inclusive.

The semiconductor light-emitting element 403 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to adopt a light-emitting element 403 having an n-type substrate so as to produce a light-emitting device constituted as described below. Specifically, in that device, an n-electrode is formed on the back surface of the n-type substrate while a p-electrode is formed on the top surface of a semiconductor layer laid on the substrate. The n- or p-electrode is mounted on one of the leads, and the p- or n-electrode is connected to the other lead by way of a wire, respectively. The size and kind of the light-emitting element 403 and the dimension and shape of the concavity can be properly changed.

Figure 5:
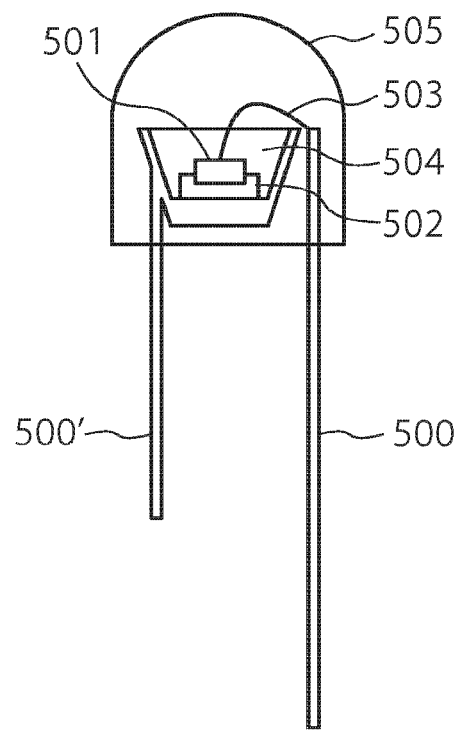
FIG. 5 shows a schematic sectional view of the light-emitting device according to another embodiment of the present invention.

FIG. 5 shows a schematic sectional view of a shell-type light-emitting device, in which a semiconductor light-emitting element 501 is mounted on a lead 500 with a mount member 502 and covered with a predip material 504. The light-emitting element 501 is connected to a lead 500' by way of a wire 503, and is sealed with a casting material 505. The phosphor of the embodiment is contained in the predip material 504.

The light-emitting device, such as a white LED device, according the embodiment is suitably used for general illumination as described above, but is also favorably used in combination with color filters and the like to serve as a lighting element such as a light source for backlighting of liquid crystal displays. Specifically, it can be adopted as a liquid crystal display backlight light source or as a red-light emitting element employed in an inorganic electroluminescence device comprising a blue-light emitting layer.

The embodiments of the present invention will be further explained in detail by Examples and Comparative examples described below, but are by no means limited to the following Examples unless deviating from the scope and spirit of the invention.

EXAMPLES

Example 1

In 300 ml of a HF aqueous solution (49%), 4.5 g of powdery $KMnO_4$ and 72 g of powdery KF were dissolved. Thereafter, a $H_2O_2$ aqueous solution (35%) was gradually dropped therein and sufficiently made to react in the HF aqueous solution to synthesize $K_2MnF_6$, which was then suction filtrated to obtain $K_2MnF_6$ powder. Independently, 12.9 g of powdery $SiO_2$ was dissolved in 600 ml of another HF aqueous solution (49%) to prepare a $H_2SiF_6$ solution. Further, 54 g of powdery KF was dissolved in 40 ml of still another HF aqueous solution (49%) to prepare a KF solution. The above $K_2MnF_6$ powder in an amount of 1.5 g was then dissolved in 600 ml of the prepared $H_2SiF_6$ solution to obtain a reaction solution, to which 120 ml of the prepared KF solution was dropped and sufficiently made to react in the reaction solution to synthesize $K_2SiF_6$:Mn. Subsequently, the synthesized $K_2SiF_6$:Mn was suction filtrated, then immediately subjected to a stirring treatment in acetone with a magnetic stirrer for 1 minute or more, and again suction filtrated to obtain powdery $K_2SiF_6$:Mn phosphor, which is hereinafter referred to as "phosphor of Example 1". The phosphor thus synthesized was subjected to composition analysis, and as a result, it was found to be $K_{2.03}(Si_{0.98}, Mn_{0.02})F_6$. Further, the phosphor was also verified to have a $K_2SiF_6$ crystal phase by XRD (X-ray diffractometry) measurement. Furthermore, the IR spectrum of the phosphor was measured to find that the relative intensity $I_r$ of the peak at about 3590 $cm^{-1}$ to that at about 1220 $cm^{-1}$ was 0.09. Still further, the internal quantum efficiency of the phosphor was measured and verified to satisfy the condition of $\eta'=96\%$.

Comparative Example 1

The procedure of Example 1 was repeated except that the stirring treatment was carried out not in acetone but in pure water, to obtain a phosphor of Comparative example 1. The phosphor was verified to be $K_2SiF_6$:Mn by the composition analysis and the XRD measurement. Further, the IR spectrum of the phosphor was measured to find that the relative intensity $I_r$ of the peak at about 3590 $cm^{-1}$ to that at about 1220 $cm^{-1}$ was 0.19. Furthermore, the internal quantum efficiency of the phosphor was measured and verified to satisfy the condition of $\eta'=76\%$.

[Evaluation of Emission Intensity Maintenance Ratio]

Figure 6:
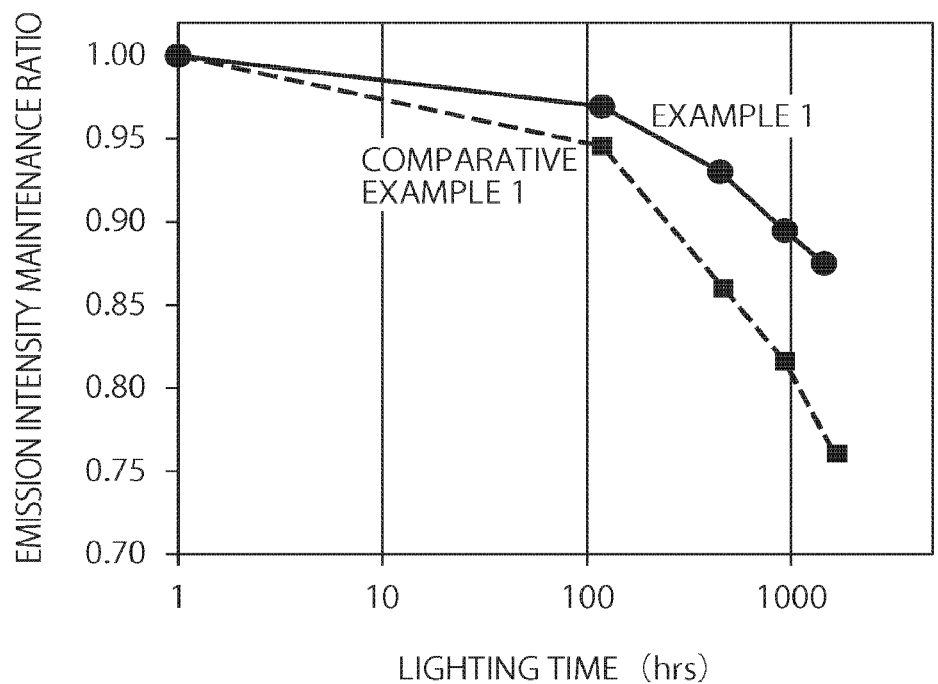
FIG. 6 is a graph showing emission intensity maintenance ratios of the phosphors in Example 1 and Comparative example 1.

The phosphor of Example 1 and a yellow-light emitting phosphor were combined and mixed with a resin, and then mounted on a GaN type LED light-emitting element and sealed to produce a light-emitting device. In the same manner, the phosphor of Comparative example 1 was used to produce another light-emitting device. Subsequently, a current was supplied to the LED of each device and thereby the devices were continuously worked. While the devices were thus made to keep working, it was observed how the phosphors of Example 1 and Comparative example 1 changed the emission intensity thereof. The results were shown in FIG. 6, in which the emission intensity maintenance ratio is plotted on the vertical axis. The emission intensity maintenance ratio was regarded as the ratio $(I_p/I_L)$ of the red emission intensity $(I_p)$ radiated from the phosphor to the emission intensity $(I_L)$ radiated from the LED. With respect to the phosphors of Example 1 and Comparative example 1, the emission intensity maintenance ratio after 500 or 1000 hours was individually measured. As a result, it was found that the phosphor of Example 1 had a maintenance ratio of 93% or 90% after 500 or 1000 hours, respectively, while that of Comparative example 1 had a maintenance ratio of 85% or 82% after 500 or 1000 hours, respectively. From the results shown in FIG. 6, it can be understood that the phosphor according to the embodiment of the present invention is prevented from the emission intensity deterioration even if the device keeps working.

Examples 2 to 5

The procedure similar to that of Example 1 or Comparative example 1 was repeated to carry out the synthesis, and then the stirring treatment was carried out in the same manner except for changing the organic solvent and the stirring time, to obtain phosphors of Examples 2 to 5 and Comparative example 2. All the phosphors were verified to be $K_2SiF_6$:Mn by the composition analysis and the XRD measurement. With respect to each of those phosphors, Table 1 shows the internal quantum efficiency and the relative intensity $I_r$ of the peak at about 3590 $cm^{-1}$ to that at about 1220 $cm^{-1}$ obtained by the IR measurement.

TABLE 1

|  | Organic solvent | Stirring time (minute) | Relative intensity $I_r$ | Internal quantum efficiency ($\eta'$) |
|---|---|---|---|---|
| Ex. 2 | ethanol | 1 | 0.08 | 91% |
| Ex. 3 | acetone | 2 | 0.06 | 90% |
| Ex. 4 | isopropyl alcohol | 10 | 0.005 | 93% |
| Ex. 5 | acetone | 10 | 0.002 | 89% |
| Com. 2 | pure water | 1 | 0.19 | 72% |

The above phosphors of Examples 2 to 5 were individually sealed on the LEDs in the same manner as those of Example 1 and Comparative example 1, and then it was observed how those red-light emitting phosphors changed the emission intensity thereof. The results are shown in Table 2.

TABLE 2

|  | Emission intensity maintenance ratio | |
|---|---|---|
|  | after 500 hours | after 1000 hours |
| Ex. 2 | 92% | 88% |
| Ex. 3 | 95% | 87% |
| Ex. 4 | 95% | 93% |
| Ex. 5 | 99% | 97% |
| Com. 2 | 88% | 81% |

The above results indicate that the phosphors according to the embodiment of the present invention can be avoided from the emission intensity deterioration while the light-emitting devices keep working.

The invention claimed is:
1. A phosphor:
   having a basic structure comprising at least one element selected from the group consisting of potassium, sodium and calcium; at least one element selected from e group consisting of silicon and titanium; and fluorine; wherein said phosphor is a manganese-activated fluoride phosphor; and shows an IR absorption spectrum in which the intensity ratio of the peak in the range of 3570 to 3610 $cm^-$to that in the range of 1200 to 1240 $cm^{-1}$ is 0.1 or less.

2. The phosphor according to claim 1, represented by the following formula (A):

$$(K_{1-p}M_p)_a(Si_{1-x-y}Ti_xMn_y)F_b \quad (A)$$

in which
M is at least one selected from the group consisting of Na and Ca, and p, a, b, x and y are numbers satisfying the conditions of
$0 \leq p \leq 0.1$,
$1.5 \leq a \leq 2.5$,
$5.5 \leq b \leq 6.5$,
$0 \leq x \leq 0.3$, and
$0 \leq y \leq 0.06$, respectively.

3. The phosphor according to claim 2, wherein p and x in said formula (A) are numbers satisfying the conditions of p=0 and x=0, respectively.

4. The phosphor according to claim 1, wherein the internal quantum efficiency η' is 70% or more.

5. A light-emitting device comprising:
a light-emitting element radiating light with a peak in the wavelength range of 440 to 470 nm inclusive, and
a phosphor layer which contains the phosphor according to claim 1.

6. The light-emitting device according to claim 5, wherein said phosphor layer further contains another green or yellow light-emitting phosphor exhibiting an emission peak in the wavelength range of 520 to 570 nm inclusive.

7. The light-emitting device according to claim 6, wherein said green or yellow light-emitting phosphor is selected from the group consisting of $(Sr,Ca,Ba)_2SiO_4$:Eu, $Ca_3(Sc,Mg)_2Si_3O_{12}$:Ce, $(Y,Gd)_3(Al,Ga)_5O_{12}$:Ce, $(Ca,Sr,Ba)Ga_7S_4$:Eu, $(Ca,Sr,Ba)Si_2O_2N_2$:Eu and $(Ca,Sr)$-αSiAlON.

8. A method for producing a phosphor, comprising:
synthesizing a manganese-activated fluoride phosphor having a basic structure comprising at least one element selected from the group consisting of potassium, sodium and calcium; at least one element selected from the group consisting of silicon and titanium; and fluorine; and then
immediately subjecting said phosphor to a stirring treatment in an organic solvent for 1 minute or more,
wherein said phosphor is synthesized in a manner where a potassium fluoride and/or a sodium fluoride are added into a hydrofluoric acid aqueous solution in which a mixture of hexafluorosilicic acid with potassium or sodium hexafluoromanganate is beforehand dissolved, so that they are made to react to synthesize the phosphor by a co-precipitation method or a poor solvent precipitation method.

9. The method according to claim 8, wherein said synthesis is carried out in a reaction solution in which the hydrofluoric acid concentration is 20 wt. % or more.

10. The method according to claim 8, wherein the amount of said organic solvent is 10 times or more the weight of said phosphor.

* * * * *